United States Patent
Kephart, Jr. et al.

(10) Patent No.: US 11,604,459 B2
(45) Date of Patent: Mar. 14, 2023

(54) REAL-TIME CONTROL USING DIRECTED PREDICTIVE SIMULATION WITHIN A CONTROL SYSTEM OF A PROCESS PLANT

(71) Applicant: EMERSON PROCESS MANAGEMENT POWER & WATER SOLUTIONS, INC., Pittsburgh, PA (US)

(72) Inventors: Richard W. Kephart, Jr., Kittanning, PA (US); Xu Cheng, Pittsburgh, PA (US); James L. Thompson, Tarentum, PA (US)

(73) Assignee: EMERSON PROCESS MANAGEMENT POWER & WATER SOLUTIONS, INC., Pittsburgh, PA (US)

( * ) Notice: Subject to any disclaimer, the term of this patent is extended or adjusted under 35 U.S.C. 154(b) by 446 days.

(21) Appl. No.: 16/510,431

(22) Filed: Jul. 12, 2019

(65) Prior Publication Data
US 2021/0011466 A1 Jan. 14, 2021

(51) Int. Cl.
G05B 19/418 (2006.01)
G06K 9/62 (2022.01)
G06F 30/20 (2020.01)

(52) U.S. Cl.
CPC ....... G05B 19/41885 (2013.01); G06F 30/20 (2020.01); G06K 9/62 (2013.01)

(58) Field of Classification Search
CPC ...... G05B 19/41885; G06F 30/20; G06K 9/62
USPC .......................................................... 703/13
See application file for complete search history.

(56) References Cited

U.S. PATENT DOCUMENTS

| | | | |
|---|---|---|---|
| 4,506,324 A | 3/1985 | Healy | |
| 4,663,704 A | 5/1987 | Jones et al. | |
| 4,977,529 A | 12/1990 | Gregg et al. | |
| 5,021,947 A | 6/1991 | Campbell et al. | |
| 5,041,964 A | 8/1991 | Cole et al. | |

(Continued)

FOREIGN PATENT DOCUMENTS

| | | |
|---|---|---|
| GB | 2 328 523 | 2/1999 |
| GB | 2 568 829 A | 5/2019 |

(Continued)

OTHER PUBLICATIONS

Hanisch_2005 (Initialization of online simulation models proceedings of the 2005 winter Simulation Conference) (Year: 2005).*

(Continued)

*Primary Examiner* — Brian S Cook
(74) *Attorney, Agent, or Firm* — Marshall, Gerstein & Borun LLP

(57) ABSTRACT

A real-time control system includes a simulation system to implement a predictive, look-ahead function that provides an operator with information that enables a higher level of situational awareness of the expected transitional events of future steps within the control program or sequence logic. The simulation system enables future steps and transitions to be monitored before they actually occur, which enables the operator to recognize and potentially take action, in a current time step, to alleviate the underlying cause of the problem, thus reducing the likelihood of or preventing a sequence stall of the control program.

34 Claims, 5 Drawing Sheets

(56) References Cited

U.S. PATENT DOCUMENTS

| | | | |
|---|---|---|---|
| 5,079,731 A | 1/1992 | Miller et al. | |
| 5,097,412 A | 3/1992 | Orimo et al. | |
| 5,119,468 A | 6/1992 | Owens | |
| 5,218,709 A | 6/1993 | Fijany et al. | |
| 5,268,834 A | 12/1993 | Sanner et al. | |
| 5,428,555 A | 6/1995 | Starkey et al. | |
| 5,568,378 A | 10/1996 | Wojsznis | |
| 5,752,008 A | 5/1998 | Bowling | |
| 5,806,053 A | 9/1998 | Tresp et al. | |
| 5,818,736 A | 10/1998 | Leibold | |
| 5,992,229 A | 11/1999 | Pyotsia et al. | |
| 6,044,305 A | 3/2000 | Larson et al. | |
| 6,104,722 A | 8/2000 | Stewart | |
| 6,192,281 B1 | 2/2001 | Brown et al. | |
| 6,373,033 B1 | 4/2002 | de Waard et al. | |
| 6,377,859 B1 | 4/2002 | Brown et al. | |
| 6,385,496 B1 | 5/2002 | Irwin et al. | |
| 6,411,923 B1 | 6/2002 | Stewart et al. | |
| 6,445,963 B1 | 9/2002 | Blevins et al. | |
| 6,459,939 B1 | 10/2002 | Hugo | |
| 6,622,059 B1 | 9/2003 | Toprac et al. | |
| 6,720,393 B1 | 4/2004 | George et al. | |
| 6,721,609 B1 | 4/2004 | Wojsznis et al. | |
| 6,745,088 B2 | 6/2004 | Gagne | |
| 7,110,835 B2 | 9/2006 | Blevins et al. | |
| 7,257,523 B1 | 8/2007 | Nixon et al. | |
| 8,527,252 B2 * | 9/2013 | Kephart | G05B 19/41885 703/13 |
| 2002/0010571 A1 | 1/2002 | Daniel et al. | |
| 2004/0153804 A1 | 8/2004 | Blevins et al. | |
| 2004/0249483 A1 | 12/2004 | Wojsznis et al. | |
| 2005/0096872 A1 | 5/2005 | Blevins et al. | |
| 2007/0078530 A1 | 4/2007 | Blevins et al. | |
| 2007/0129917 A1 | 6/2007 | Blevins et al. | |
| 2007/0168065 A1 | 7/2007 | Nixon et al. | |
| 2007/0174225 A1 | 7/2007 | Blevins et al. | |
| 2008/0027704 A1 | 1/2008 | Kephart et al. | |
| 2014/0135947 A1 | 5/2014 | Friman et al. | |
| 2017/0176098 A1 * | 6/2017 | Kong | F25J 3/0486 |

FOREIGN PATENT DOCUMENTS

| | | |
|---|---|---|
| JP | 07-248941 A | 9/1995 |
| JP | 08-314760 A | 11/1996 |
| TW | 494356 B | 7/2002 |
| WO | WO-97/38362 | 10/1997 |
| WO | WO-97/45778 A1 | 12/1997 |
| WO | WO-2018/198624 A1 | 11/2018 |

OTHER PUBLICATIONS

Schumann_2018 (Time to Marry Simulation Models and Machine LEarning, Benjamin Schumann Consulting, May 7, 2018) (Year: 2018).*

Andre Hanisch et al., "Initialization of Online Simulation Models", Proceedings of the 2005 Winter Simulation Conference, M. E. Kuhl, N. M. Steiger, F. B.Armstrong, and J. A. Joines, eds., Dec. 4-7, 2005, pp. 1795-1803.

Cavalieri et al., "Impact of fieldbs on communication in robotic systems", IEEE Transactions on Robotics and automation, Feb. 1997.

Jietae Lee, "On-line PID Controller Tuning from a Single, Closed-Loop Test", AIChE Journal, vol. 35, No. 2, Feb. 1989, pp. 329-331.

Search Report for Application No. GB2009214.4, dated Dec. 10, 2020.

* cited by examiner

REAL-TIME CONTROL USING DIRECTED PREDICTIVE SIMULATION WITHIN A CONTROL SYSTEM OF A PROCESS PLANT

TECHNICAL FIELD

The present invention relates generally to process plants such as power generation and industrial manufacturing plants and, more particularly, to a simulation system that performs synchronized, look-ahead, simulation of the operation of a control network to predict and avoid future problems within the process plant.

DESCRIPTION OF THE RELATED ART

Distributed process control systems, like those typically used in power generation, chemical manufacturing, petroleum processing or other process plants, typically include one or more process controllers communicatively coupled to one or more field devices via analog, digital or combined analog/digital buses. The field devices, which may be, for example, valves, valve positioners, switches, transmitters (e.g., temperature, pressure, level and flow rate sensors), burners, etc. are located within the process environment and perform process functions such as opening or closing valves, measuring process parameters, etc. in response to control signals developed and sent by the process controllers. Smart field devices, such as the field devices conforming to any of the well-known Fieldbus protocols may also perform control calculations, alarming functions, and other functions commonly implemented within or by a process controller. The process controllers, which are also typically located within the plant environment, receive signals indicative of process measurements made by the field devices and/or other information pertaining to the field devices and execute a control application that runs, for example, different control modules which make process control decisions, generate process control signals based on the received information and coordinate with the control modules or blocks being performed in the field devices, such as HART and Fieldbus field devices. The control modules within the controller send the process control signals over the communication lines to the field devices to thereby control the operation of the process.

Information from the field devices and the controller is usually made available over a data highway to one or more other computer devices, such as operator workstations, personal computers, data historians, report generators, centralized databases, etc., typically placed in control rooms or other locations away from the harsher plant environment. These computer devices may also run applications that may, for example, enable an operator to perform functions with respect to the process, such as changing settings of the process control routine, modifying the operation of the control modules within the controller or the field devices, viewing the current state of the process, viewing alarms generated by field devices and controllers, keeping and updating a configuration database, etc.

As an example, the Ovation® control system, sold by Emerson Process Management, includes multiple applications stored within and executed by different devices located at diverse places within a process plant. A configuration application, which resides in one or more operator workstations, enables users to create or change process control modules and to download these process control modules via a data highway to dedicated distributed controllers. Typically, these control modules are made up of communicatively interconnected function blocks, which are objects in an object oriented programming protocol and which perform functions within the control scheme based on inputs thereto and provide outputs to other function blocks within the control scheme. The configuration application may also allow a designer to create or change operator interfaces which are used by a viewing application to display data to an operator and to enable the operator to change settings, such as set points, within the process control routine. Each of the dedicated controllers and, in some cases, field devices, stores and executes a controller application that runs the control modules assigned and downloaded thereto to implement actual process control functionality. The viewing applications, which may be run on one or more operator workstations, receive data from the controller application via the data highway and display this data to process control system designers, operators, or users using the user interfaces, and may provide any of a number of different views, such as an operator's view, an engineer's view, a technician's view, etc. A data historian application is typically stored in and executed by a data historian device that collects and stores some or all of the data provided across the data highway while a configuration database application may executed in a still further computer attached to the data highway to store the current process control routine configuration and data associated therewith. Alternatively, the configuration database may be located in the same workstation as the configuration application.

As noted above, operator display applications are typically implemented on a system wide basis in one or more of the workstations and provide preconfigured displays to the operator or maintenance persons regarding the operating state of the control system or the devices within the plant. Typically, these displays take the form of alarming displays that receive alarms generated by controllers or devices within the process plant, control displays indicating the operating state of the process, the controllers and other devices within the process plant, maintenance displays indicating the operating state of the devices within the process plant, etc. These displays are generally preconfigured to display, in known manners, information or data received from the process control modules or the devices within the process plant. In some known systems, displays are created through the use of objects that have a graphic associated with a physical or logical element and that is communicatively tied to the physical or logical element to receive data about the physical or logical element. The object may change the graphic on the display screen based on the received data to illustrate, for example, that a tank is half full, to illustrate the flow measured by a flow sensor, etc. While the information needed for the displays is sent from the devices or configuration database within the process plant, that information is used only to provide a display to the user containing that information. As a result, all information and programming that is used to generate alarms, detect problems within the plant, etc. must be generated by and configured within the different devices associated with the plant, such as controllers and field devices during configuration of the process plant control system. Only then is this information sent to the operator display for display during process operation.

Generally speaking, the control of processes in an industrial plant, such as a power plant, often involves implementing a time ordered set of control actions on various equipment within the plant. The initiation of each successive control action is predicated on the completion of the previous control action as well as the condition of some number of permissives to be satisfied. The control of the plant thus proceeds in a step-by-step manner and the control system software that performs this time ordered operation is programmed using a software construct known as sequencing logic. In particular, sequence logic is a logical set of operations, permissives, and actions, implemented as a computer program, which is executed in a control system. Generally, each sequence logic includes a series of related steps that are executed in a consecutive manner. Each step generally includes or represents some number of permissives that need to be satisfied and one or more actions to be completed before the conclusion of that step. Permissives are typically a function of one or more external feedback inputs, parameters, and statuses that are evaluated in a logical fashion by the control program. For example, the evaluation or status of each permissive is the result of a logical operation that evaluates to a true or false condition. These permissives can be, for example, the state of field equipment (e.g. running/stopped/open/close), the completion of a previous step or action, values of process parameters being above or below a particular threshold, etc. Moreover, the transition from each consecutive step in the logic sequence is predicated on the evaluation of each permissive signal that applies to that step.

As a result, the application designer configures the sequence logic to require that the permissives be satisfied, meaning that these permissives must evaluate to the expected Boolean state of true or false, prior to going to the next step. Thus, at each step, a plurality of permissives are evaluated, and when these permissives are satisfied, the actions for that step are taken. Once the actions are complete, that step is indicated as complete and the process repeats for the next step in the sequencing logic.

During normal plant operation, the control system is generally operated in an automatic mode and the sequence program or sequencing logic evaluates the feedback signals in determining when to transition to the next step in the sequencing logic without direct human interaction. The associated actions are then performed at each step by the sequence program.

At times, however, the plant may experience an abnormal situation where, for example, one of the expected feedback signals related to the permissives, for example, does not occur in the manner expected. This situation may result in the sequence program halting or stalling. Once the sequence program is stalled, however, human interaction is generally required to resolve the issue and to allow the sequence program to continue. Importantly, a sequence stall can result in the halt of equipment, which can result in manufacturing delays, lost production or revenue, higher operating costs and possibly even equipment damage. In a traditional control system however, the operator may not be aware of an impending abnormal situation, and the resulting sequence stall, until the situation actually occurs and the sequence is halted.

It is also known to develop and place a simulation system within a plant to simulate the operation of the control network as connected within the plant. For example, such a simulation system may be used to test the operation of the plant in response to new or different control variables, such as set-points, to test new control routines, to perform optimization, to perform training activities, etc. While many simulation systems have been proposed and used in process plants, only the most complex simulation systems are typically able to perform high fidelity simulation of the process plant because of the ever changing conditions within the plant, including the degradation of devices over time, the presence of unaccounted for disturbance variables within the plant, etc. Moreover, in many known control systems, it can be difficult to set up or create a simulation of the process plant or a portion of the process plant as simulation activities are performed separately from the display and control activities performed in the on-line environment of the process plant. As a result, most traditional simulation systems are not closely coordinated with the actual operation of the control network within the process plant.

To assist in solving this problem, U.S. Pat. No. 8,527,252 describes a process control simulation system that performs real-time simulation or prediction of an actual process control network as that network is running within a process plant in a manner that is synchronized with the operation of the actual process control network. This synchronized simulation system may be automatically updated periodically during the operation of the actual process control network to reflect changes made to the actual process control network, as well as to account for changes which occur within the plant itself, i.e., changes which require updating a process model used within the simulation system. Moreover, this simulation system may be executed in a fast mode which operates faster than the real time control to perform simulation of the plant over a particular time horizon, to assist in predicting the operation of the control system when, for example, different control actions are taken, such as for training purposes, testing, etc. This synchronized simulation system provides for a more readily accessible and usable simulation system, as the plant models used within the simulation system are synchronized with and are kept up-to-date with respect to the current process operating conditions whenever the simulation is executed.

SUMMARY

An improved real-time control system implements a simulation system to implement a predictive, look-ahead function that provides an operator, such as a plant operator, with information that enables a higher level of situational awareness of the expected transitional events of future steps within the control program or sequence logic. This simulation system enables future steps and transitions to be monitored before they actually occur, which enables the operator to recognize and potentially take action, in a current time step, to alleviate the underlying cause of the problem, thus reducing the likelihood of or preventing a sequence stall of the control program.

More particularly, a control system executes a simultaneous simulation system with a look-ahead feature, in addition to the normal execution of the control or sequence program, to enable the operator to preview or view potential future problems in the running of the current control or sequence program. In one case, the control system uses a simulation engine that simulates the control of the process in parallel with the actual plant operation and control. However, the plant simulation is executed in a faster than real-time speed so that the simulated sequence proceeds ahead of the actual control sequence in time to predict the future operation of the current plant using the current plant inputs and states. Moreover, the state of the simulation may be initialized from the current state of the plant, and so any stall conditions resulting from invalid equipment configurations or other types of human error will be or should be encountered by the simulated control sequence or simulation system. Likewise, because the simulated sequence executes faster than real-time, any potential stall conditions (or other process control problems) should be encountered by the simulation system first, thereby enabling the simulation system to predict a stall situation before the stall situation actually occurs within the plant. This prediction can then be provided as a notification to the operator to provide the operator with a chance to react proactively, to thereby potentially resolve the problem situation and prevent the actual control sequence from stalling at that step, or to minimize the time that the control sequence would be stalled.

In some examples, the simulation can run "on-demand," or periodically, based, for example, on a particular command from the operator, or may be executed in any other automated manner. In one case, an advanced pattern recognition (APR) model can be built for each sequence step based on collected normal operational data (which may be, for example, either on-line data or offline historical data). Each APR model may execute in an APR engine in real-time when the corresponding sequence step is active. If the APR engine determines that there is a significant process deviation from a "normal" operational mode or state of the process, as defined by the APR model, then the fast-forward simulation engine can be automatically activated. The simulation may run for a preview horizon at least equaling to the pre-defined allowable step transition time in the control sequence, which represents the point where a stall flag may be set.

Moreover, the system can derive display data from the simulation, and may provide this display data to an operator to provide the operator with information such as the expected feedback signal values and their simulated values, and the order in which these signals occur. The operator can then use this information to monitor the actual control sequence to prevent or avoid stalls in the control sequence.

If desired, the simulation system may also have a process model which is synchronized with the actual process to make the simulation more accurate. In particular, the simulation system and, in particular, the process model used by the simulation system, may be automatically updated (e.g., periodically) during the operation of the actual process control network to reflect changes made to the actual process control network, as well as to account for changes which occur within the plant itself, i.e., changes which require updating a process model used within the simulation system. The synchronized simulation system described herein provides for a more readily accessible and usable simulation system, as the plant models used within the simulation system are synchronized with and up-to-date with respect to the current process operating conditions, making the look-ahead predictions more accurate.

DESCRIPTION OF THE PREFERRED EMBODIMENTS

Figure 1:
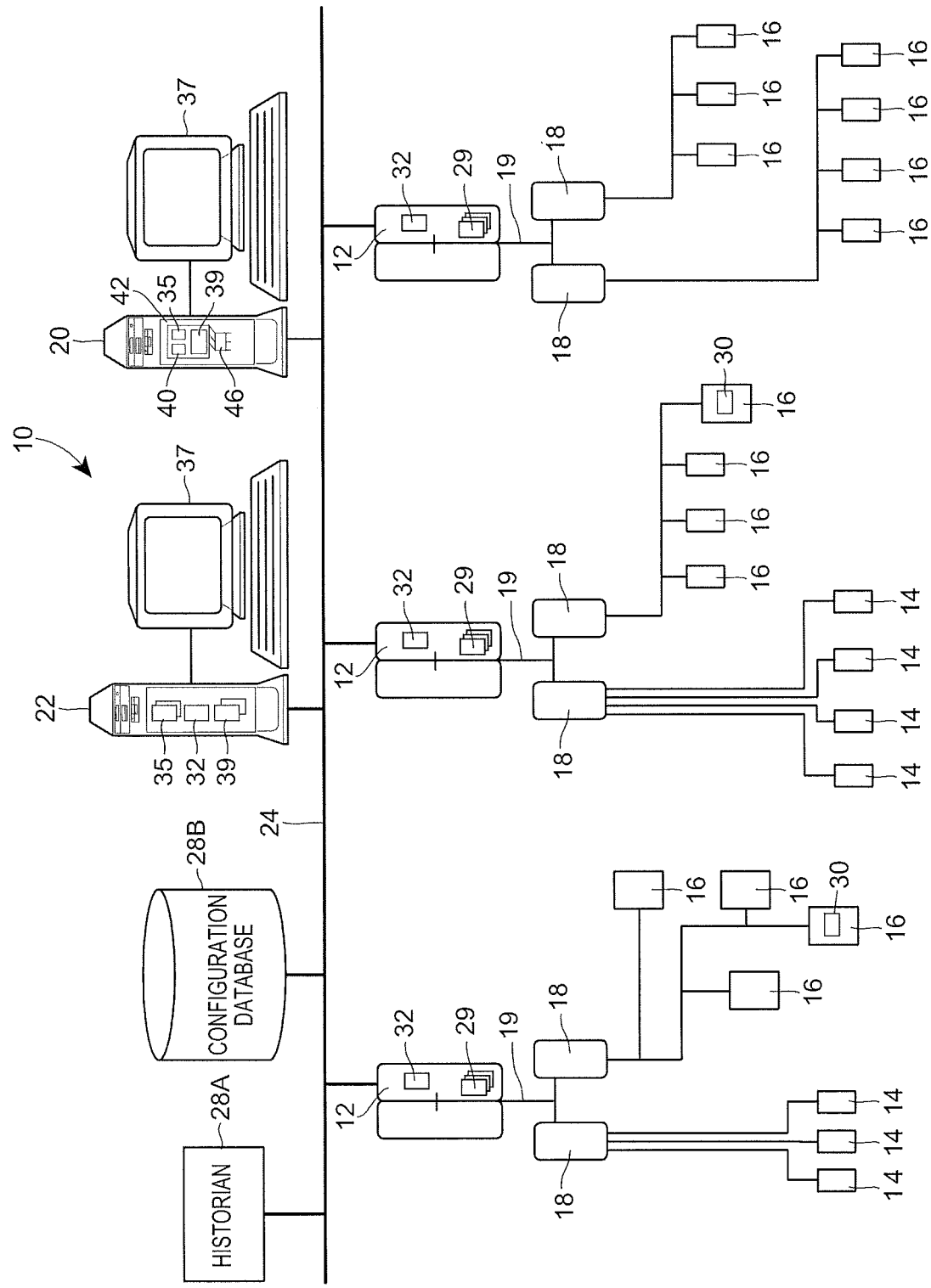
FIG. 1 is a block diagram of a distributed process control network located within a process plant including an operator workstation that implements a look-ahead simulation system configured to be synchronized with the operation of an actual process control network, to thereby simulate the operation of the process plant to preform predictive control.

Referring now to FIG. 1, an example control network for a process plant 10, such as that associated with a power generation plant, is illustrated in detail. The process plant 10 of FIG. 1 includes a distributed process control system having one or more controllers 12, each of which is connected to one or more field devices 14 and 16 via a bus 19 connected to input/output (I/O) devices or cards 18 which may be, for example, Fieldbus interfaces, Profibus interfaces, HART interfaces, standard 4-20 ma interfaces, etc. The bus 19 can be any type of communication media such as a serial, an Ethernet (copper or fiber) or a wireless bus or connection. Moreover, the I/O cards 18 can be located physically at the process controllers 12 or can be located remotely. The controllers 12 are also coupled to one or more host or operator workstations 20 and 22 via a data highway 24 which may be, for example, an Ethernet link. Databases 28A and 28B may be connected to the data highway 24 and operate as data historians which, in the case of the data historian 28A, collect and store historical parameter, status and other data associated with the controllers 12 and field devices 14, 16 within the plant 10 and, in the case of the configuration database 28B, may store configuration and other control data for the plant 10. For example, the database 28B may operate as a configuration database that stores the current configuration of the process control system within the plant 10 as downloaded to and stored within the controllers 12 and field devices 14 and 16. While the controllers 12, the I/O cards 18 and the field devices 14 and 16 are typically located down within and are distributed throughout the sometimes harsh plant environment, the operator workstations 20 and 22 and the databases 28A and 28B are usually located in a control room or other less harsh environments easily assessable by controller or maintenance personnel.

As is known, each of the controllers 12, which may be by way of example, the Ovation® controller sold by Emerson Process Management Power and Water Solutions, Inc., stores and executes a controller application that implements a control strategy using any number of different, independently executed, control modules or blocks 29. Each of the control modules 29 can be made up of what are commonly referred to as function blocks wherein each function block is a part or a subroutine of an overall control routine and operates in conjunction with other function blocks (via communications called links) to implement process control loops within the process plant 10. As is well known, function blocks, which may but need not be objects in an object oriented programming protocol, typically perform one of an input function, such as that associated with a transmitter, a sensor or other process parameter measurement device, a control function, such as that associated with a control routine that performs proportional-integral-derivative (PID), fuzzy logic, etc. control, or an output function that controls the operation of some device, such as a valve, to perform some physical function within the process plant 10. Of course hybrid and other types of complex function blocks exist such as model predictive controllers (MPCs), optimizers, etc. While the Fieldbus protocol and the Ovation® system protocol use control modules and function blocks designed and implemented in an object oriented programming protocol, the control modules could be designed using any desired control programming scheme including, for example, sequential function chart, ladder logic, etc. and are not limited to being designed and implemented using the function block or any other particular programming technique.

In the plant 10 illustrated in FIG. 1, the field devices 14 and 16 are connected to the controllers 12 and may be standard 4-20 ma devices, may be smart field devices, such as HART, Profibus, or FOUNDATION® Fieldbus field devices, which include a processor and a memory, or may be any other desired types of field devices. Some of these devices, such as Fieldbus field devices (labeled with reference number 16 in FIG. 1), may store and execute modules, or sub-modules, such as function blocks, associated with the control strategy implemented in the controllers 12. Function blocks 30, which are illustrated in FIG. 1 as being disposed in two different ones of the Fieldbus field devices 16, may be executed in conjunction with the execution of the control modules 29 within the controllers 12 to implement one or more process control loops, as is well known. Of course, the field devices 14 and 16 may be any types of devices, such as sensors, valves, transmitters, positioners, etc. and the I/O devices 18 may be any types of I/O devices conforming to any desired communication or controller protocol such as HART, Fieldbus, Profibus, etc.

Moreover, sequencing logic 32 may be stored in the controllers 12 or in one or more of the workstations 20, 22 or other computer device, to oversee or control the various control programs to perform sequencing control activities. As noted above, the sequencing logic modules 32 implement a time ordered set of control actions on various equipment within the plant. The initiation of each successive control action is predicated on the completion of the previous control action as well as the condition of some number of permissives to be satisfied, which the sequencing logic 32 monitors. The control of the plant thus proceeds in a step-by-step manner based on the operation of the sequencing logic 32 and, more particularly, each sequence logic 32 is a logical set of operations, permissives, and actions executed in a control system. Generally, each sequence logic includes a series of related steps that are executed in a consecutive manner. Each step generally includes or represents some number of permissives that need to be satisfied and one or more actions to be completed before the conclusion of that step. Permissives are typically a function of one or more external feedback inputs, parameters, and statuses that are evaluated in a logical fashion by the control program. For example, the evaluation or status of each permissive is the result of a logical operation that evaluates to a true or false condition. These permissives can be, for example, the state of field equipment (e.g. running/stopped/open/close), the completion of a previous step or action, values of process parameters being above or below a particular threshold, etc. Moreover, the transition from each consecutive step in the logic sequence is predicated on the evaluation of each permissive signal that applies to that step.

Still further, in a known manner, one or more of the workstations 20 and 22 may include user interface applications to enable a user, such as an operator, a configuration engineer, a maintenance person, etc. to interface with the process control network within the plant 10. In particular, the workstation 22 is illustrated as including one or more user interface applications 35 may which may be executed on a processor within the workstation 22 to communicate with the database 28, the control modules 29 or other routines within the controllers 12 or I/O devices 18, with the field devices 14 and 16 and the modules 30, 32 within these field devices, controllers, etc. to obtain information from the plant, such as information related to the ongoing state of the process control system. The user interface applications 35 may process and/or display this collected information on a display device 37 associated with one or more of the workstations 20 and 22. The collected, processed and/or displayed information may be, for example, process state information, alarms and alerts generated within plant, maintenance data, etc. Likewise, one or more applications 39 may be stored in and executed in the workstations 22 and 20 to perform configuration activities such as creating or configuring the modules 29, 30, and 32 to be executed within the plant, to perform control operator activities, such as changing set-points or other control variables, within the plant, etc. Of course the number and type of routines 35 and 39 is not limited by the description provided herein and other numbers and types of process control related routines may be stored in an implemented within the workstations 20 and 22 if desired.

The workstation 20 of FIG. 1 is also illustrated as including a simulation application 40 which may include a process plant simulator, a user interface application and data structures for performing synchronized simulation of the process plant 10 in the manner described herein. The simulation application 40 can be accessed by any authorized user (such as a configuration engineer, an operator or some other type of user) to perform simulation of the process plant control network being implemented by the control blocks 29, 30 and 32 as well as other controller routines executed within the controllers 12 and possibly the field devices 14, 16. The simulation application 40 enables a user to perform different simulation and prediction activities with respect to the process plant 10 while the control system of the process plant 10 remains operational and on-line to control the plant 10.

As illustrated in FIG. 1, the simulation application 40 is stored in a memory 42 of the workstation 20 and each of the components of the simulation application 40 is adapted to be executed on a processor 46 associated with the workstation 20. While the entire simulation application 40 is illustrated as being stored in the workstation 20, some components of this application could be stored in and executed in other workstations or computer devices within or associated with the plant 10.

Furthermore, the simulation application 40 can provide display outputs to the display screen 37 associated with the workstation 20 or any other desired display screen or display device, including hand-held devices, laptops, other workstations, printers, etc. Likewise, the simulation application 40 may be broken up and executed on two or more computers or machines that may be configured to operate in conjunction with one another.

Generally speaking, the simulation application 40 provides for or enables the simulation of the operation of the process plant 10 and in particular, the simulation of the process plant control system implemented by the control routines 29, 30 and 32 within the controllers 12 and field devices 14 and 16, in conjunction with the actual plant 10 being controlled. While the plant 10 that is being controlled will be described herein as a power generation plant being controlled using distributed control techniques, the simulation technique described herein can be used in other types of plants and control systems, including industrial manufacturing plants, water and waste water treatment plants, as well as control systems implemented centrally or within a single computer, and therefore not distributed throughout the plant.

Figure 2:
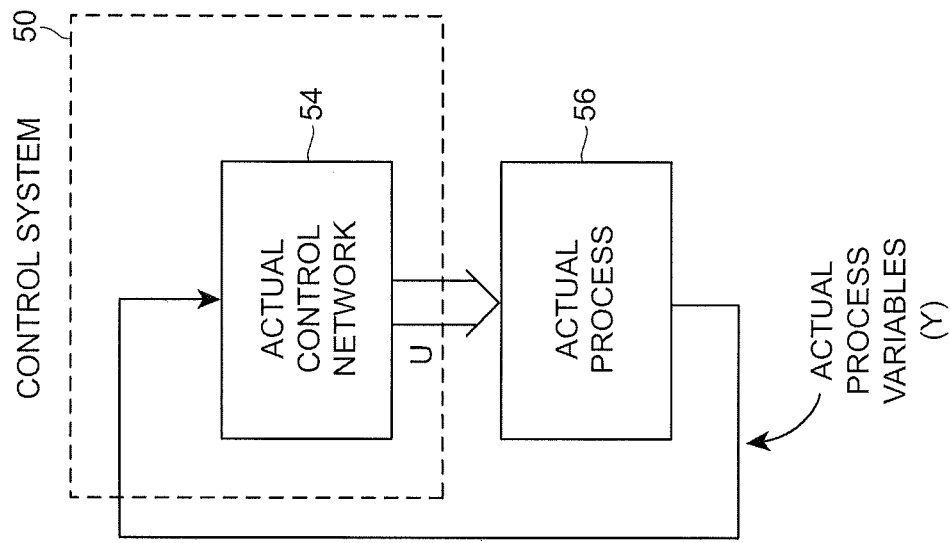
FIG. 2 is a logical block diagram of a process plant control system and a simulation system for simulating the process plant control system.
Figure 2:
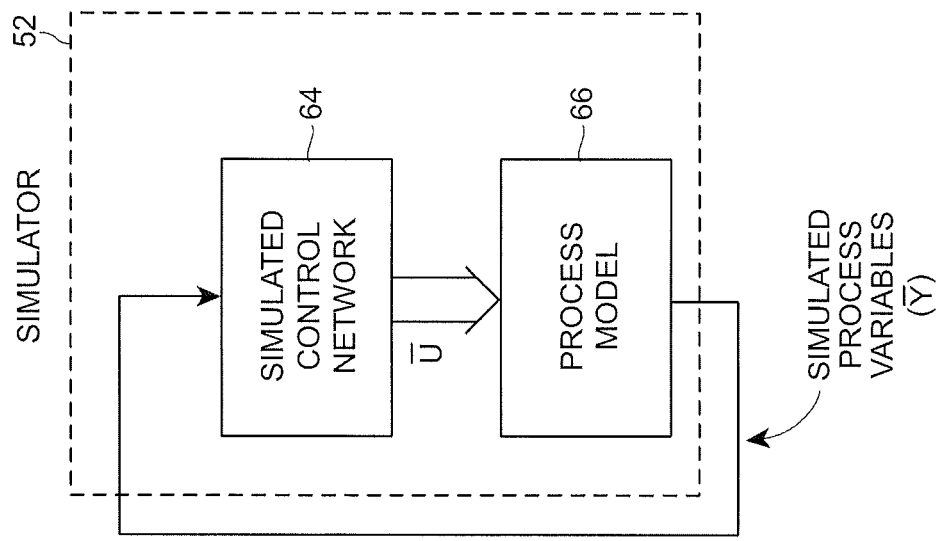

FIG. 2 generally illustrates a process control system 50 and a simulation system 52 implemented within the plant 10 of FIG. 1. In particular, the process control system 50 includes an actual process control network 54 communicatively and physically coupled to a process 56. As will be understood, the actual process control network 54 includes the control modules 29, 30 and 32 of FIG. 1 as well and any other control routines disposed in and executed within the various control devices (e.g., controllers 12) and field devices (e.g., devices 14 and 16) of the plant 10 of FIG. 1. Likewise, the actual process 56 includes the units, machines, devices and associated hardware set up to implement the process being controlled. For example, in a power generation plant, the process 56 may include generators, fuel delivery systems including heat exchanges, condensers, steam generators, valves, tanks, etc. as well as sensors and transmitters disposed within the plant to measure various process parameters or variables. Thus, as illustrated in FIG. 2, the actual process control network 54 includes the controllers which produce one or more control signals to be delivered to the various control devices within the plant 56 and the control signals implemented by or generated by the sequencing logic 32 to control the control modules within the process, and which together operate to control the plant 56 according to some specific control technique. These control signals are illustrated by the vector U in FIG. 2 to indicate that the actual process control network 54 may provide a vector of control signals to the process 56 to control the operation of the plant. Likewise, as illustrated in FIG. 2, a vector Y of process variables are measured within the process 56 (such as by sensors, etc.) and are delivered as feedback signals to the process control network 54 for use in producing the control signals U. Of course, the actual control network 54 can include any desired types of controllers which implement any desired types of control routines or techniques, such as PID, fuzzy logic, neural network, model predictive control routines, etc.

As illustrated in FIG. 2, the simulation system 52 includes a simulated control network 64 and a process model 66. The simulated control network 64 is, generally speaking, a copy of the actual process control network 54 including a copy or a duplicate of the control routines associated with and/or running within the actual controllers and other devices of the process control network 54, including the sequencing logic 32. However, instead of being distributed within multiple different devices, the simulated control network 64 may include one or more communicatively connected sequencing and other control modules that are implemented on a single computer device, such as the operator workstation 20 of FIG. 1. Such a simulation system that stores and simulates, on a single computer, various control routines designed to be implemented in different computers as part of a distributed control network is described in detail in U.S. Pat. No. 7,257,523, which issued on Aug. 14, 2007, entitled "Integrating Distributed Process Control System Functionality on a Single Computer" the disclosure of which is hereby expressly incorporated by reference herein. In any event, the simulation system 52 may be implemented as part of the simulation application 40 of FIG. 1. Moreover, the process model 66 used within the simulation system 52 is designed and configured to model the process 56, and may implemented as any desired or suitable type of process model, such as an $n^{th}$ order transfer function model, a neural network model, etc. Of course, the type of model to be used may be chosen as the best type of model for the particular type of plant or process being modeled, as well one that enables on-line updating capabilities as described in more detail below. Still further, if desired, the process model 66 may be made up of a plurality of individual process models, each modeling or associated with a different part of the plant 10, such as with a different control loop within the plant.

The overall concept of the simulation approach as outlined in FIG. 2 provides a simulation system 52 that includes a control network 64 developed as a copy of the actual control network 54 and a process model 66 that models the actual process 56 of the plant. In this configuration, the control network 54 and therefore the simulated control network 64 includes of all functions and components that make up the actual control network 54 (e.g. the controllers, the function blocks, the man-machine-interface applications (MMIs), etc. of the actual control network). Of course, the simulated control network 64 of the simulation system 52 may be developed by copying the actual control routines (e.g., the control routines 29, 30 and 32 of FIG. 1), the user interface applications, the configuration applications, etc. as stored in, for example, the configuration database 28 of FIG. 1, the controllers 12, the field devices 14, 16, the workstations 20, 22, etc., along with storing data or other information related to identifying the associated inputs and outputs of the control routines within the process plant. This input/output signal identification data is helpful to enable the simulation system 52 to communicate with the control system 50 during operation of the control system 50 to thereby synchronize the operation of the simulation system 52 with the control system 50 while the process plant 10 is operating on-line.

As will be understood, during operation of the plant 10, the actual control network 54 operates in any usual or known manner to calculate the manipulated variables or control signals U which are applied to the process 56. The process 56 then responds by operating to develop actual process variables Y, which are measured by various sensors within the plant and are provided as feedback to the control network 54. The manipulated and process variables (U and Y, respectively) are shown as vector quantities to designate a plurality of values. Of course, each of the associated elements of these vector quantities may be made up of discrete values with respect to time, wherein the size of each time step is equal to the execution period of the associated control function, i.e., the scan or operation rate of the controllers.

The values of the manipulated variables (control signals) U are calculated at each time step, and the values of the process variables Y result from sampling the process variables at each time step. Of course, these values are determined by the sequencing logic 32 which runs the control modules 29 and 30. For the purpose of this discussion, the current time step is denoted as a time k and thus the values of the manipulated variables and the process variables at the current time step are denoted as $U_k$ and $Y_k$ respectively. Thus, according to this operation, the time response of the control network 54 is completely determined by the vectors U, Y and a vector of internal state variables X which defines the specifics of the control procedures (or controller configurations) used in the control network 54, e.g., the controller gains or other parameters defining the specifics of the control techniques implemented by the controllers within the control network 54. In other words, the elements of the state vector X define the internal variables that are used by the control functions to calculate the manipulated variables U. These state variables may be, for example, values that are a function of the tuning parameters or accumulated time values used by such functions as timers, integrator values utilized by PID controllers, neural network weighting coefficients used by neural network controllers, scaling factors used by fuzzy logic controllers, model parameters or matrices used by model predictive controllers, etc. These state values are also discrete with respect to time and thus the state vector X at the kth time step is denoted as $X_k$. The collective set of state vectors U, Y, X can then be said to define the overall state of the control system. These values are continuously calculated by the control system.

Figure 3:
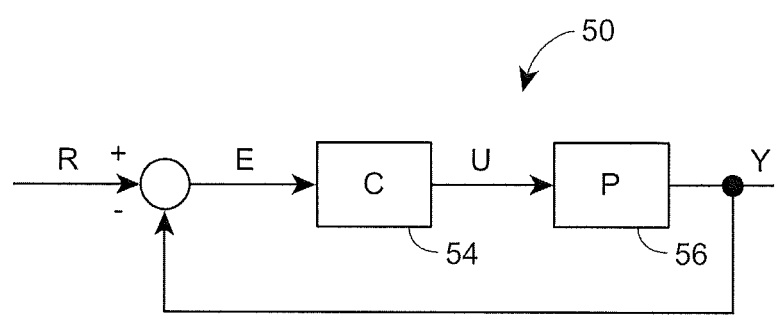
FIG. 3 is a simplified logical block diagram of a control loop of the plant control system shown in FIG. 2.

Referring now to FIG. 3, the control system 50 of FIG. 2 is illustrated in block diagram form as a feedback control loop. In this case, the actual control network 54 is represented by the block denoted as C. The process 56 is represented by the block denoted as P. Moreover, in this case, the input to the control network 54 is shown as a vector of set-points R which are compared to the measured or determined process variables Y to produce an error vector E which, in turn, is used by the control network 54 to produce the control signal or manipulated variable vector U. Of course, the elements of the set-point vector R represent the desired values for the process variables Y that are to be controlled, and these set-point values are generally determined by an operator or an optimizer routine (not shown). In the case of a power plant control system, these set-point values may be the desired values of flow, pressure, temperature, megawatts, etc. for the associated process variables within the power generation equipment.

Figure 4:
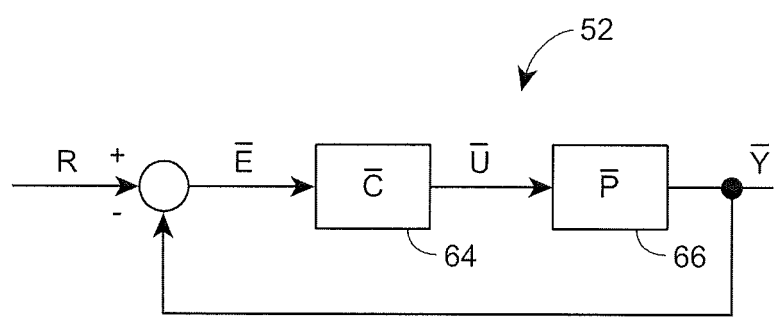
FIG. 4 is a simplified logical block diagram of a simulated control loop implemented by the simulation system shown in FIG. 2.

In a similar manner, the simulation system 52 is shown in block diagram form in FIG. 4. The same vector R of set-point values from the actual control network 54 is input to the simulation system 52. Here, the simulated control network 64 is denoted by the block $\hat{C}$ and is a replication of the control network 54 in terms of controller operation. Thus, all of the controllers, function block, sequencing logic, and algorithms that make up the actual control network 54 are replicated in the simulated control network 64. The simulated manipulated variables or control signals $\overline{U}$ are shown as being produced or calculated by the simulated control network 64 and provided to the process model 66.

In the simulation system 52, however, the values of the process variables $\overline{Y}$ are calculated using a mathematical model of the process 56, referred to as the process model 66 and denoted as $\overline{P}$. Of course, the exact structure of the process model 66 can vary and, furthermore, various different model structures can be utilized for various different parts of the process 56 so that, for example, each process variable can utilize or be determined by a unique process model structure. Applicable model structures that may be used include first principle (differential equation) models, transfer function (ARX) models, state space models, neural network model, fuzzy logic models, etc.

Like the actual control system 50, the time response of the simulation system 52 is completely described by the $\overline{U}$, $\overline{Y}$ and $\overline{X}$ vectors. Here, the elements of the simulator state vector $\overline{X}$ contain the equivalent state variables X as in the actual control system 50. However, the simulator state vector $\overline{X}$ also includes additional elements which are the internal state variables associated with the process model 66, and these variables are used by the process model 66, along with the manipulated variables $\overline{U}$, to calculate the simulated process variables $\overline{Y}$.

Thus the simulator state vector $\overline{X}$ is an augmentation of the control system state vector X where $\overline{X}$ includes the control system state vector (denoted as θ) and the vector of process model internal state variables (denoted as ψ). Here, the values of θ are identical to X.

The simulator model architecture is preferably such that the value of each of the model internal state variables ($\psi_k$) at the kth time step can be calculated using the $U_{k-1}$ and $Y_k$ vectors from the control system. Of course, the details of the specific calculations are specific and particular to the particular model structure that is employed, and these calculations are known to those of ordinary skill in the art. Moreover, it will be realized that the process state variables that are calculated by the simulator system can be a function of the process variables and manipulated variables as well as, in some instances, the process variables and/or the manipulated variables themselves. This all depends on the type of models that are employed. In any event, this property enables the synchronization of the actual control system 50 and the simulation system 52 during normal operation of the process plant. In particular, at the kth time step, the total simulator state can be synchronized to the total control system state using the $U_{k-1}$, $X_k$ and $Y_k$ vectors. For the simulator total state update, the elements of $θ_k$ are updated directly from the vector $X_k$ and the elements of the process state vector $\psi_k$ are calculated (determined) using $U_{k-1}$ and $Y_k$. Again the specific details of the calculations depend on the structure of the process model that is employed.

Thus, generally speaking, during operation, the simulation system 52 operates in parallel with but in a manner that is synchronized with the operation of the process control system 50. In particular, if the simulation system 52 was simply operated in parallel with the actual control system 50 but not synchronized therewith, the simulated process variables $\overline{Y}$ would eventually tend to drift from the actual process variables Y output from the process 56, due mainly to the effects of un-modeled dynamics and plant-model mismatch.

To overcome this problem, the simulation system 52 remains synchronized with the actual control system 50 by periodically operating in a tracking mode in which the simulation system 52 receives the $U_{k-1}$, $Y_k$ and $X_k$ vectors from the actual control network 54 for each controller time step. The simulation system 52 then initializes the state of its simulated process control network 64 with the state information from the actual control network 54. Moreover, in the tracking mode, an update module of the simulation system 52 recalculates the internal state variables ($\psi_k$) using the $U_{k-1}$ and $Y_k$ vectors to update the process model 66 so as to reflect the actual operation of the process during the last controller time interval, thereby tracking or modeling the actual characteristics of the process 56 as measured or evident from the last controller scan time interval. Thus, while operating in the tracking mode, the simulation system 52 is continually initialized to the current plant conditions, including controller conditions and plant characteristics.

Figure 5:
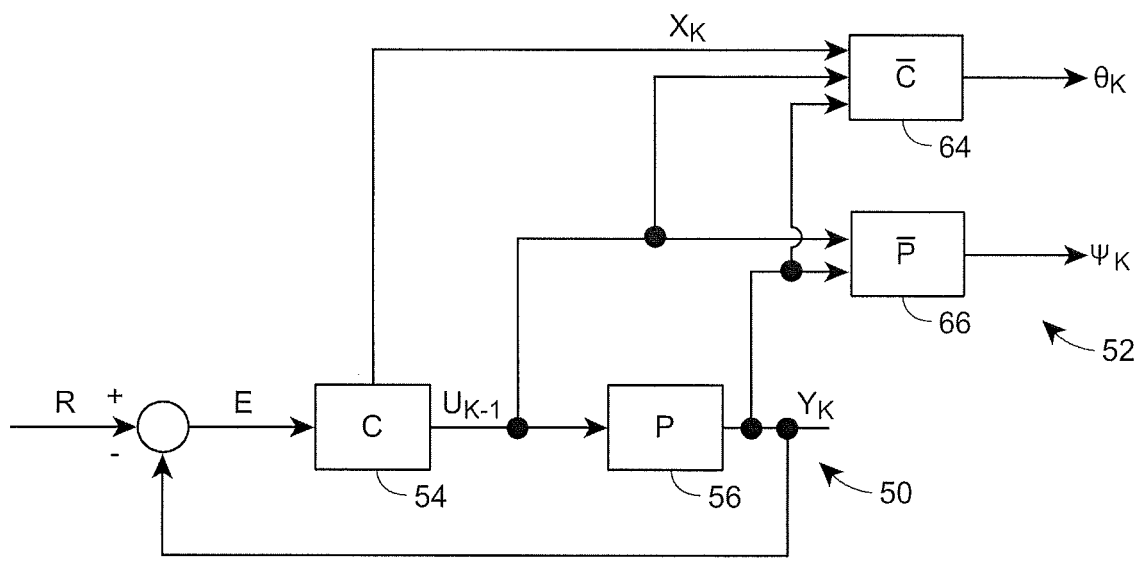
FIG. 5 is a logical block diagram illustrating the communicative interconnections between the simulation system and the control system of FIG. 2 during a tracking mode of operation.

FIG. 5 illustrates the operation of the simulation system 52 in the tracking mode in more detail. In particular, the process control system 50 is shown in FIG. 5 at the time instance k. However, in this case, the simulated process control network 64 of the simulation system 52 is configured to receive the internal state vector $X_k$ of the controller 54, the control signal vector $U_{k-1}$, and the process variable vector $Y_k$ and updates the simulated controller 64 with these vectors. Likewise, the process model 66 receives the control signal vector $U_{k-1}$ and the process variable vector $Y_k$ and determines the new process state vector $\psi_k$ from these values. In this manner, the process model 66 is or may be updated after each scan of the process control system to reflect the actual operation of the process plant.

As will be understood, therefore, during tracking mode, the simulation system 52 is constantly following or tracking the process operation and is updating its state parameters to reflect the current state, not only of the process control network 54, but of the characteristics of the process 56 itself by recalculating, or updating the state of the process model 66. As a result, the simulation system 52 remains synchronized with the operation of the process control system 50 and the process plant at all times during the tracking mode, making the simulation system 52 immediately available at any time to perform simulation with a high degree of fidelity.

To perform a particular predictive simulation, the simulation system 52 may be, at any time, placed in a prediction mode to perform actual simulation of the process control system 50 over some future time horizon. The actual simulation may take many forms or may simulate many different types of controller/process activities. However, in all cases, the simulation system 52 operates in parallel with the actual control system 50. In particular, during the prediction mode, the simulation system 52 stops updating the control network image 64 and the process model 66 with signals from the actual process plant, but instead, operates to perform a prediction based on the most recent set of state variables X developed during the tracking mode. In other words, during the prediction mode, the simulated process variables $\overline{Y}$ are calculated based on the process model 66 in closed loop fashion using the simulated process control network 64 and the set points R provided to the simulation system 52. In this case, the simulation system 52 is coupled to a user interface to enable a user, if desired, to change one or more parameters of the simulated control system or the simulated process to thereby simulate the response of the process to a control change or to a process dynamics change. Such a change may, for example, be a change to one or more of the set-points R, a change of a measured process variable, a change to the control routine itself, a change to a disturbance variable in the process, etc. However, in other cases, as detailed below, the simulation system 52 may operate in a look-ahead mode to simulate the operation of the plant 10 or process control network 54 and the process 56 based on the current operational values and states of the process control network 54 and the plant 56.

If desired, the simulation system 52, while in the prediction mode, may execute in one of three sub-modes, including a real-time sub-mode, a fast-time sub-mode and a slow-time sub-mode. In the real-time sub-mode, the simulation of the process variables proceeds in real time (i.e. at the same speed or scan rate as the actual control system 50). In a power plant control system application, this mode may be utilized by plant personnel to test proposed actions and inputs to the control system. In this scenario, the proposed action is applied to the (simulated) plant and the simulated response is observed to ensure that the action has the desired effects and/or that no abnormal conditions arise as a result of the action.

In the fast-time sub-mode, the simulated process variables are calculated at a rate faster than real time (i.e., than the controller scan rate). This mode may be utilized to quickly observe the predicted response of the processes variables over a future time horizon, to test the response of the plant to a new controller set-point, bias, other operator input or some other change in a control routine, etc. For example, at any given time, the predicted values and resulting trajectories of one or more process variables can be displayed for the next ten minutes or over some other prediction horizon, such as a horizon associated with the process returning to steady state operation.

In the slow-time sub-mode, the operator may view the operation of the simulated control slower than the actual process operating time or scan rate. This sub-mode may be used in for example, fast processes to provide the operator with more time to view and analyze the operation of the process in response to a contemplated change. Moreover, this sub-mode may be advantageously used when the simulation system 52 is used to perform training operations.

During operation, the integrated and synchronized simulation system will alternatively utilize both the tracking and prediction modes to perform simulation and prediction. In particular, during the time periods when the simulation system 52 is operating in tracking mode, the simulation system 52 is constantly being updated with the overall state information from the actual control system 50. This state data, as described above, may be sent to the simulation system 52 by the control system 50 on a periodic basis using the signal addresses stored as part of the configuration system. In a preferred mode, the simulation system 52 will receive a new set of state data from the process control system during, or as a result of every scan of the controllers within the process control system 50. In other words, the state data within the process control system 50 may be collected after each controller operation or scan and sent to the simulation system 52. This data may be addressed or sent individually to the simulation system 52 using appropriate communication procedures, or may be collected at some intermediary device and sent as a bulk set of data to reduce communications overhead within the process control system. Of course, the simulation system 52 may instead receive the controller state information at a different rate, which is preferably a periodic rate, such as after every other scan, every fifth scan, etc. In this manner, while the simulation system 52 is in the tracking mode, the actual control system 50 and the simulation system 52 operate in synchronized fashion, which results from the fact that, at each time step associated with the periodic rate, the overall state of the simulation system 52 is updated to identically match the actual control system 50.

However, at any instant an operator or other user or an automated system can put the simulation system 52 into the prediction mode. During operation in this mode, the sub-mode may be selected to be real-time mode to implement, for example, an evaluation of the effect of a set-point or tuning parameter change, to evaluate the effect of a control program change on the process, to evaluate a change in a process disturbance variable, etc. In another case, a slow-time sub-mode or a fast-time sub-mode may be selected, in which the state of the simulation system evolves at a speed slower or faster than the real-time scan or operational rate of the process control network 50. Of course, the slow-time and fast-time sub-modes may be implemented by changing the scan or operational period of the controllers and control programs within the simulated process control network 64. Moreover, if desired, the simulated process variables may be collected, stored and then reflected on associated historical trends at the end of the fast time execution, instead of or in addition to displaying these variables on the operator, engineer and maintenance personnel interfaces.

In some instances the simulation system 52 may be operated such that a fast-time execution cycle will be executed automatically every 'N' time steps of the control system 50, where 'N' may be defined by the operator if so desired. In this situation, the simulation system 52 operates in tracking mode until the 'Nth' time step, at which time the simulation system 52 is automatically placed in the prediction mode for a single execution of a fast-time operation over a selected time horizon. At the end of the fast-time simulation, the simulator displays may be updated with the predicted process variables over the configured time horizon and/or with other information, such as any simulated alarms or alerts which were generated during the fast-time operation, etc. At the end of this fast-time operation, the simulation system 52 may automatically return to the tracking mode to update the process model 66 and the simulated control network 64 with new state variables from the actual process. This automatic operating condition may be used to update trend displays which show the predicted trajectories of the process variable(s) of interest, which is particularly helpful in, for example, the real-time integration of control functions and simulation during actual operation of a power plant and for implementing an automatic method that has the potential to eliminate process upsets and plant trips due to human error. The effect of operator action on plant emissions and thermodynamic/process efficiency can also be observed in this mode.

However, in a very useful case, the simulation system may be used to perform a predictive, look-ahead function that provides an operator, such as a plant operator, with information that enables a higher level of situation awareness of the expected transitional events of future steps within the control program or sequencing logic. This simulation system enables future steps and transitions to be monitored before they actually occur, which enables the operator to recognize and potentially take action at a current time step, to avoid or reduce the likelihood of a control problem, thus reducing the likelihood of or preventing a sequence stall of the control program.

More particularly, a control system executes a simultaneous, fast-time, look-ahead simulation system that provides operator guidance, along with the normal execution of the control or sequence program, to enable the operator to preview or view potential future problems in the running of the current control or sequence program. During this time, the operator guidance system uses a simulation engine that simulates the process in parallel with the actual plant operation and control. However, the plant simulation is executed in a faster than real-time speed so that the simulated sequence proceeds ahead of the actual control sequence in time to predict the future operation of the current plant using the current plant inputs and states, including the operation of the sequencing logic. Moreover, the state of the simulation is initialized from the current state of the plant and so any stall conditions resulting from invalid equipment configurations or other types of human error will be or should be encountered by the simulated look-ahead sequence. Likewise, because the simulated process control sequence executes faster than real-time, any potential stall conditions should be encountered by the simulation system first, thereby enabling the simulation system to predict a stall situation before the stall situation actually occurs within the plant. This prediction can then be provided as a notification to the operator to provide the operator with a chance to react proactively, to thereby potentially resolve the problem situation and prevent the actual control sequence from stalling at that step, or to minimize the time that the control sequence would be stalled.

In some examples, the predictive simulation can run "on-demand," or periodically, based, for example, on a particular command from the operator or in any other automated manner. In another example case, an advanced pattern recognition (APR) model can be built for each sequence step (for the sequencing logic) based on collected normal operational data (which may be, for example, either on-line data or offline historical data stored in, for example, the historian database 28A of FIG. 1). Each APR model may be executed in an APR engine in real-time when the corresponding sequence step is active. If the APR engine using the APR model sees significant process deviation from "normal" operational mode or state of the process as defined by the APR model, then the fast-forward, look-ahead simulation can be automatically activated within the simulation system. The simulation may run for a preview horizon at least equaling to the pre-defined allowable step transition time, which represents the point where a stall flag may be set.

Moreover, the system can derive display data from the look-ahead simulation, and may provide this display data to an operator to provide the operator with information such as the expected feedback signal values and their simulated values, and the order in which these signals occur. The operator can then use this information to monitor the actual control sequence to prevent or avoid stalls in the control sequence.

Figure 6:
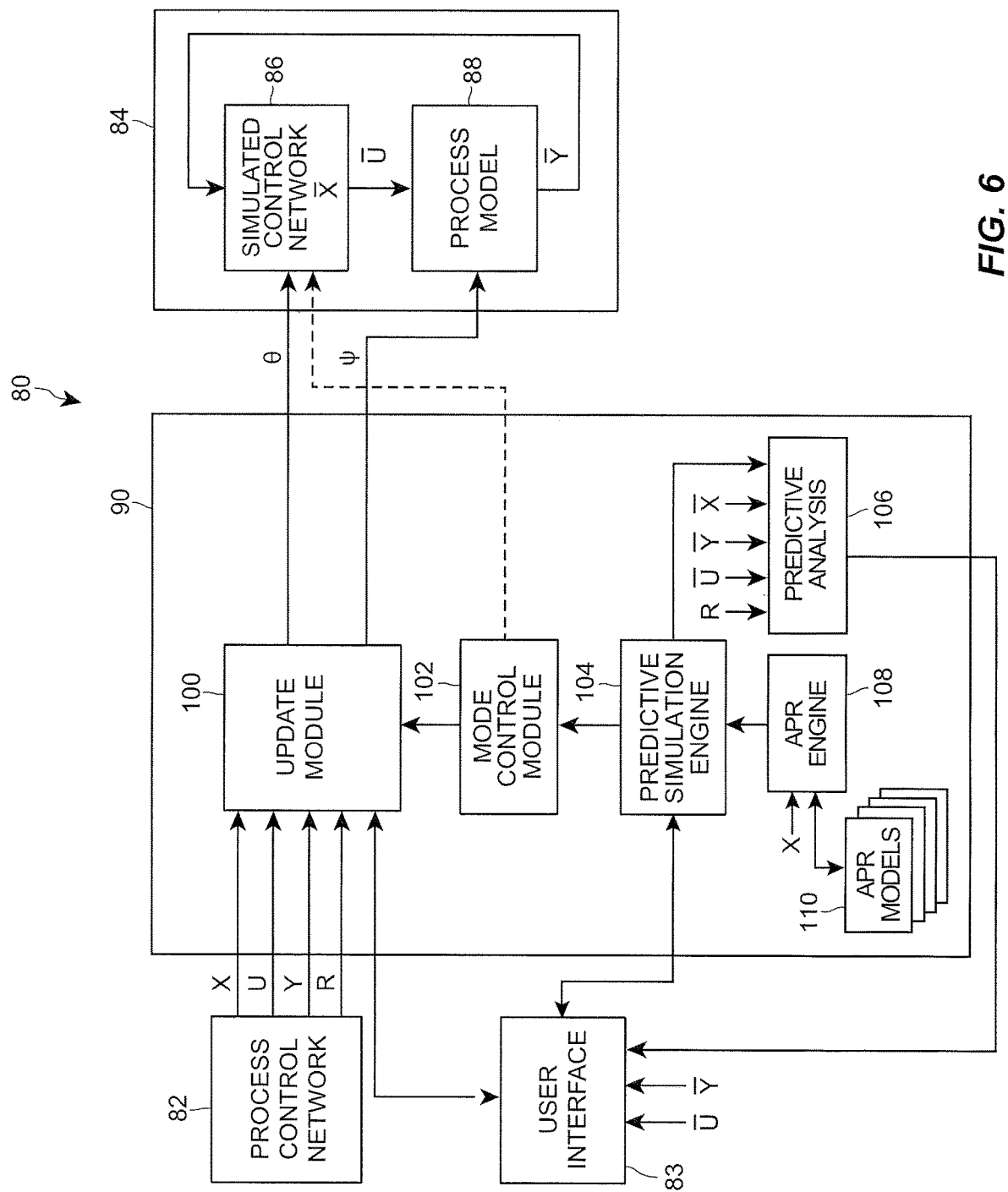
FIG. 6 is a block diagram of a simulation system that implements predictive control look-ahead features for use in controlling a process as described herein.

FIG. 6 illustrates one manner of implementing a control system 80 with an integrated, look-ahead, predictive simulation as described herein, in which a simulation engine performs predictive control actions to implement advanced control within a plant. In particular, the control system 80 of FIG. 6 includes a process control system 82, a simulation system 84 (which may be any of the simulation systems of FIGS. 1-5), and a user interface 83 (which may be, for example, the user interface system 20/37 of FIG. 1) coupled to the process control system 82 and to the simulation system 84. The process control system 82 may be any typical control system within a plant that includes one more process controllers coupled to various field devices, machines, input/output devices, etc. and to the user interface 83. In some cases, the process control system 82 may implement sequencing logic, although this is not strictly necessary and other types of control can be implemented. The user interface 83 may be any desired man-machine interface including a computer, laptop, smart phone, or other interface device and may be, for example, associated with or may be part of a process control system interface used by a process operator, a maintenance system (used by maintenance personnel), a safety system, etc. The user interface 83 may provide a user with typical or desired control system information, maintenance system information, safety system information, or any other desired information from the plant and process control network 82.

As generally described in the examples of FIGS. 1-5, the simulation system 84 includes a simulated process control network 86 communicatively coupled to a process model 88. Still further, as illustrated in FIG. 6, a coordination system 90 is connected between the process control network 82 and the simulation system 84 and operates to (1) update the simulated control network 86 and process model 88 to keep the simulated control network 86 and the process model 88 synchronized with the actual process control network 82 and the actual process, and (2) run look-ahead, predictive simulations to predict or detect problems that may be encountered by the actual process control network 82, and to provide the results of these predictions to a user via, for example, the user interface 83.

In the example system of FIG. 6, the coordination system 90 includes an update module 100, a mode control module 102, a predictive simulation initiation module 104, and a simulation predictive analysis module 106. The coordination system 90 may additionally include an advanced pattern recognition (APR) analysis engine 108 and a set of APR models 110 stored in a memory. If desired, the coordination system 90 may be stored as a computer implemented application or routine in one or more computer devices, including any of the devices of FIG. 1, and may be executed in the processor of one or more computer devices to coordinate the operation of the on-line control system or network 82 with the simulation system 84 in a manner that provides predictive, look-ahead control.

Generally speaking, the mode control module 102 controls the mode of the simulation system 84 to be in one of two modes, namely, in an updating state or in a running a simulation state. The update module 100 is communicatively connected to the process control network 82 using any desired communication structure, and is communicatively coupled to and is responsive to the mode control module 102. The update module 100 operates to receive the process control network state variables, including the controller state variables X, as well as the appropriate process input and output state variables, such as the set points R, the control signals U and the process variables Y, from the process control network 82. If desired, the controller state variables X may be received at any periodic rate, which may be the same rate as or a different rate than the periodic rate at which the state variables U and Y are received from the process 82. Moreover, if desired, the controller state variables X may be received or updated at a periodic rate by being updated only when a change is actually made to one or more of these variables within the process control system 82.

The update module 100, which may be executed in the same or a different computer device than the simulated process control network 86 (or a portion thereof) and the process model 88 (or a portion thereof), operates during a tracking mode to receive the state variables X, U and Y and to calculate the state vector $\psi_k$ and to provide the $\theta$ and $\psi_k$ vectors to the appropriate parts of the simulated control network 86 and the process model 88.

However, as noted above, the mode control module 102 controls the operation of the simulation system 84 to be in one of two modes. In particular, in a first mode, the mode control module 102 controls the update module 100 to periodically receive the first and second state variables and to update the simulated process control network 86 and the process model 88 using the developed state variables $\theta$ and $\psi_k$. In a second mode, the mode control module 102 causes the simulated process control network 86 to perform a look-ahead simulation using the current process network operating parameters and using one or more simulated process variables $\overline{Y}$ to produce the one or more simulated control signals $\overline{U}$, and the process model 88 uses the one or more simulated control signals $\overline{U}$ to produce the one or more simulated process variables $\overline{Y}$. In this case, the mode control module 102 may operate the simulated process control network 86 in the second mode to execute at a real-time speed that is faster, and preferably much faster (e.g., between 10 times or 100 times faster), than the operational or real-time speed of the process control network 82 to produce one or more predicted process variable or state variables over a time horizon.

In some cases, the control of the plant proceeds in a step-by-step manner and the control system software that performs this time ordered operation is programmed using a software construct known as sequencing logic. In particular, sequence logic is a logical set of operations, permissives, and actions, implemented as a computer program, which is executed in a control system. Generally, each sequence logic includes a series of related steps that are executed in a consecutive manner. Each step generally includes or represents some number of permissives that need to be satisfied and one or more actions to be completed before the conclusion of that step. Permissives are typically a function of one or more external feedback inputs, parameters, and statuses (process control variables or parameters) that are evaluated in a logical fashion by the control program. For example, the evaluation or status of each permissive is the result of a logical operation that evaluates to a true or false condition. These permissives can be, for example, the state of field equipment (e.g. running/stopped/open/close), the completion of a previous step or action, values of process parameters being above or below a particular threshold, etc. Moreover, the transition from each consecutive step in the logic sequence is predicated on the evaluation of each permissive signal that applies to that step.

As a result, the sequence logic, to move the controller from one process control state or stage to another process control state or stage, requires that the permissives be satisfied, meaning that these permissives must evaluate to the expected Boolean state of true or false, prior to going to the next step. Thus, at each step, a plurality of permissives are evaluated, and when these permissives are satisfied, the actions for that step are taken. Once the actions are complete, that step is indicated as complete and the process controller repeats for the next step in the sequencing logic. If this control paradigm is used in the process controller, the simulation system 84 may simulate the operation of the sequence logic, one stage at a time, using the process model over a time horizon or a particular period of time, to determine if and when the simulated sequence logic switches stages (or when the permissives derived from various process variables for each stage are met).

During the simulation, or at the end of the simulation over a particular time horizon, the simulation predictive analysis module 106 receives simulated process parameters, process control values, process states or variables, sequencing logic variables, control set points, and/or any other simulated process control or controller information from the simulation system (e.g. from the simulated process control network 86 and from the process model 88), and may perform any desired analysis on the received information to detect potential problems with the process (that is being controlled by the process control network 82 and being simulated by the process model 88) that may occur in the future. These problems may be the failure of the process to change a state or the process control system or sequencing logic to transfer from one state to another during an expected or typical time period, the setting or activation of various alarms or other events within the process, etc. The simulation predictive analysis engine 106 may store specific events (or expected events, such as a change of process control state or sequencing logic state) or any other process operation performance criteria or criterion, for various different stages and/or components of the actual process and may compare the simulated results to these stored expectations to determine if there is a potential problem with the process that is likely to occur in the future. Upon detecting a problem or an issue, such as the predicted failure of the control system 82 to switch between states or stages of sequencing logic in a particular amount of time, the generation of one or more alarms or alerts, or other problems, the predictive analysis engine 106 may provide a warning, an alert, an alarm, or other information to the user of the user interface system 83 informing the user of the potential problem. In addition or alternatively, the predictive analysis module or engine 106 may provide other information to the user, such as the values of various simulated variables, or other information about the simulated process 88 or the simulated control network 86 (at a future time), to inform the user of issues or problems which may arise in the future in the actual process control network 82, based on the simulated control network 86.

In any event, the user, upon receiving the analysis results, may then take one or more actions to understand or view the cause of the predicted problem or sequence halt, and may take one or more steps within the actual process control system or network 82 to prevent or avoid the problem from occurring in the actual process control network 82. In some cases, the simulation predictive analysis system or engine 106 may automatically initiate a process control network change to prevent or attempt to prevent the predicted future problem. Upon taking corrective action, the coordination system 90 may update the simulation system 84 using the mode control module 102 and the update module 100, and may then run the simulation system 84 in a look-ahead predictive mode again to determine if the control or process problem has been alleviated or avoided.

In some cases, a user at the user interface 83 may initiate the look-ahead, predictive simulation (which is based on the current process control network parameters) at will or whenever the user wishes. In other cases, the look-ahead simulation may run automatically or semi-automatically. For example, the user may, via the user interface 83, program or specify that the predictive simulation initiation engine 104 run a fast-time, look-ahead simulation periodically, at specified times, or based on the occurrence of one or more specified events (such as whenever the control system 82 switches states or modes, at a preset time after an event, such as 1 hour after switching control states, etc.) In addition or alternatively, the engine 104 may run a look ahead simulation periodically, such as every five minutes, every hour, every day, etc. or at any other specified rate or time.

In one instance, the predictive simulation engine 104 may perform an analysis of one kind or another to determine if and when to run a look-ahead predictive simulation automatically for determining if there are potential future control problems. In one example case, the coordination system 90 may use the set of advanced pattern recognition (APR) models 110 and the APR engine 108 which uses the models 110 to perform abnormal situation detection using advanced pattern recognition on the current state of the control system 82. In particular, an APR model 110 may be stored for each separate state or logic interlock or sequence step of the control routine (such as the sequencing logic 32 of FIG. 1) of the process plant and each such model 110 may be based on or may be indicative of the normal or desired operation of the plant during each of these times or states or sequence steps. The APR engine 108 may use the model 110 appropriate for the current operational state of the process or of the control routine or sequencing logic to determine if process parameters are out of the normal (in some manner), if the state is taking too long or longer than usual to end, etc. Upon detecting a potential abnormal condition in the plant, based on the current APR model 110, and the current process parameter values or states, the APR engine 108 may then automatically run or cause the mode control module 102 to run a predictive or look-ahead simulation using the simulation system 84. Thus, in this manner, the APR engine 108 will automatically detect when to run the look-ahead or predictive simulation based on the current state of the process (or the current value or values of various process parameters and/or control parameters) and the APR model 110 most appropriate to the current state or operational state of the process.

If desired, the APR engine 108 may use any type of modeling or regression routine to determine if there appears to be an abnormal condition in the plant, that may require or suggest the use of the look-ahead or predictive simulation. These models could be, for example, neural network models, model predictive control modules, regression models, high/low limits on one or more process parameters or values, etc. Moreover, the APR models 110 for each step or stage of the sequencing logic may be created from or derived from real process data, including process controller variables, process outputs, process inputs, etc. This data may be real-time data or data stored in a historian database (e.g., the historian database 28A of FIG. 1).

While it is preferable to operate the simulation system on a computer that is communicatively connected to and integrated (with respect to communications) with the process control system, as is illustrated in the example of FIG. 1, it is also possible to operate or implement the simulation system described herein on a dedicated computer that is not directly integrated with the control functions. In this case, however, the simulation system, which must include the closed-loop dynamics of the process control system, must continually receive the process variables and state variables from the control system. In particular, the state variables (including the process variables) must be continually sent from the control system to the simulation computer at a rate that enables the simulation to be performed in real-time. Such a communication interface may, however, be provided using any known or standard interface protocols, such as OPC, TCP/IP etc.

Moreover, if desired, the simulation systems described herein may be distributed in different devices throughout the process plant. For example, the simulated process control network 86 may include a simulation controller module (that is a copy of an actual control module) in each control device in which the actual control modules 29 and 30 and 32 reside. In this case, the process model 88 may include a sub-model associated with a particular portion of the process plant (such as a particular process loop) disposed within the same process control device and communicatively connected to the appropriate simulation control model. Here, the simulation control module and the sub-model of the process operate together to perform simulation on a loop by loop basis within various different control devices. In this case, the simulation control modules may be in communication with operator interface routines stored within the workstations 20 and 22 (of FIG. 1) using standard communications to indicate or illustrate the operation of the simulation control modules during the prediction mode. Likewise, the simulated control modules and the process models within the various devices within the plant may receive process state information directly from the associated control modules 29, 30 and 32 of the actual process control network, or from an update module located within the same or a different device.

Of course, as will be understood, when used in a power generating plant, as well as other types of plants, the simulation systems as described herein may, among other things, (1) provide for the real-time integration of simulation and control functions during actual operation of a power plant, (2) provide a real-time prediction of emissions of a power generating plant over a finite future time horizon, (3) provide a mechanism for future generation market pricing, (4) enhance the effectiveness of the plant operations personnel by providing a real-time predictive function for each of the major process variables associated with the plant in response to the closed loop action of the control system, (5)

provide a real-time indication of the onset of an abnormal situation, (6) allow the simulator initial conditions to be reset to a particular time period such that operating dynamics of the power plant can be "replayed" going forward in time from the time period that corresponds to the initial condition time step (which may be used to analyze past plant operation), (7) allow operations and/or engineering personal to evaluate the effect of a set-point, tuning parameter, configuration or programming change on the simulator before applying it to the actual plant, and (8) reduce plant trips due to operator action/inaction by providing a prediction of the major process variables for each time step extending over some finite future horizon.

Moreover, as will be understood, the simulation systems described herein include the approach of distributing the simulation functions as an integral part of the overall control functions. In this approach, the simulation is utilized as an augmentation of the control functions to provide predictive functions associated with the process variables. The requirements and constraints associated with distributing the simulation are identical to the corresponding control functions.

When implemented, any of the simulation software described herein may be stored in any computer readable memory such as on a magnetic disk, a laser disk, or other storage medium, in a RAM or ROM of a computer or processor, etc. Likewise, this software may be delivered to a user, a process plant or an operator workstation using any known or desired delivery method including, for example, on a computer readable disk or other transportable computer storage mechanism or over a communication channel such as a telephone line, the Internet, the World Wide Web, any other local area network or wide area network, etc. (which delivery is viewed as being the same as or interchangeable with providing such software via a transportable storage medium). Furthermore, this software may be provided directly without modulation or encryption or may be modulated and/or encrypted using any suitable modulation carrier wave and/or encryption technique before being transmitted over a communication channel.

While the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

What is claimed is:

1. A process control system for controlling a process, comprising:
    a process controller coupled to the process for controlling the process;
    a simulation system for simulating operation of the process controller as connected to the process, the simulation system including:
        a simulated process control network that uses one or more simulated process variables to produce one or more simulated control signals to simulate the operation of the process controller as connected within the process, and
        a process model communicatively connected to the simulated process control network that uses the simulated control signals to produce the one or more simulated process variables;
    a simulation coordination system communicatively coupled to the process controller and to the simulation system, wherein the simulation coordination system includes:
        a simulation initiation module that initiates the simulation system during on-line operation of the process controller, wherein the simulation system executes a simulation in faster than real-time operation of the process controller using current process controller information to produce one or more predicted process control variables, and
        a simulation analysis system coupled to the simulation system that receives the one or more predicted process control variables from the simulation system, wherein the simulation analysis system analyzes the one or more predicted process control variables to detect a future problem in the operation of the process controller as coupled to the process, and upon detecting the future problem in the process controller as coupled to the process, generates one or more indications of the future problem and provides the one or more indications of the future problem to a user; and
    an operational criteria detection module coupled to the process control system to detect whether one or more operational criteria are met in the process controller as coupled to the process, and to run the simulation system upon detecting that the one or more operational criteria are met.

2. The process control system of claim 1, wherein the process controller includes sequencing logic that progresses from one process control state to another process control state in sequence based on one or more process variables, and wherein the simulation analysis system determines if the sequencing logic is predicted to progress from one process control state to another process control state in a particular period of time.

3. The process control system of claim 2, wherein the sequencing logic determines when to progress from one process control state to another process control state based on one or more permissives derived from the one or more process variables, and wherein the simulation analysis system determines if the one or more permissives generated within the simulation system enable the sequencing logic within the simulated process control network to progress from the process control state to the another process control state during the simulation.

4. The process control system of claim 1, wherein the simulation coordination system includes an update module communicatively connected to the process control network to periodically receive a first state variable indicative of a current configuration of the process controller during operation of the process controller and to periodically receive a second state variable indicative of an operation of the process during operation of the process controller, wherein the update module periodically configures the simulated process control network with the first state variable and wherein the update module periodically uses the second state variable to update the process model.

5. The process control system of claim 4, wherein the update module periodically receives the first and second state variables at a scan rate used by the process controller within the process control network.

6. The process control system of claim 4, wherein the simulation coordination system includes a mode control module that controls the operation of the simulation system to be in one of two modes, including a first mode in which the update module periodically receives the first and second state variables and updates the simulated process control network and the process model using the first and second state variables and a second mode in which the simulated process control network operates using the one or more simulated process variables to produce the one or more simulated control signals, and the process model uses the one or more simulated control signals to produce the one or more simulated process variables.

7. The process control system of claim 1, further including a user interface that enables a user to make the simulation coordination run a simulation.

8. The process control system of claim 1, wherein the simulation initiation system executes automatically to run the simulation system to execute at a speed that is faster than the operational speed of the process control network to produce a predicted process variable at a time horizon.

9. The process control system of claim 8, wherein the simulation coordination system executes periodically to run the simulation system to detect a problem within the process controller as coupled to the process.

10. The process control system of claim 1, further including one or more advanced pattern recognition (APR) models that define normal operation of the process controller as coupled to the process, and wherein the operational criteria detection module includes an APR engine that uses one of the APR models to detect whether the one or more operational criteria are met in the process controller as coupled to the process.

11. The process control system of claim 10, wherein the process controller includes sequencing logic having multiple stages and wherein the simulation coordination system includes a different APR model for each of multiple stages of the sequencing logic.

12. The process control system of claim 1, wherein the process controller is a distributed process controller including control routines distributed in two or more processing devices.

13. A method of operating a process control system having a process control network connected within a process plant, the method comprising:
receiving a first state variable indicative of a current configuration of the process control network during on-line operation of the process control network;
receiving a second state variable indicative of a current operation of the process plant during on-line operation of the process control network;
configuring a simulated process control network using the first state variable;
updating a process model using the second state variable;
detecting, at an operational criteria detection module, whether one or more operational criteria are met in the process control system;
during continued on-line operation of the process control network, simulating, at a simulation system and responsive to detecting that the one or more operational criteria are met, operation of the process control system by running the updated simulated process control network using the updated process model at a scan rate faster than the real time scan rate of the process control network to produce one or more predicted control variables over a time horizon;
analyzing, at a simulation coordination system, the one or more predicted control variables based on an expected performance criterion to determine if a problem exists within the operation of the process control system within the time horizon; and
notifying a user of the determined predicted problem in the process control system.

14. The process control method of claim 13, wherein periodically receiving the first state variable includes periodically receiving the first state variable at a scan rate used by one or more controllers within the process control network and wherein receiving the second state variable includes receiving the second state variable at a scan rate used by one or more controllers within the process control network.

15. The process control method of claim 13, including periodically automatically simulating operation of the process control system at a speed that is faster than the operational speed of the process control network to produce the one or more predicted control variables over the time horizon, and analyzing the one or more predicted control variables based on an expected performance criterion to determine if a problem exists within the operation of the process control system within the time horizon and displaying an indication of the predicted problem to a user.

16. The process control method of claim 13, further including changing the operation of the process control system to avoid the predicted problem.

17. The process control method of claim 13, wherein the process controller includes sequencing logic that progresses from one process control state to another process control state in sequence based on one or more process variables, and wherein analyzing the one or more predicted control variables based on an expected performance criterion includes determining if the sequencing logic is predicted to progress from one process control state to another process control state in a particular period of time.

18. The process control method of claim 17, wherein the sequencing logic determines when to progress from one process control state to another process control state based on one or more permissives derived from the one or more process variables, and wherein analyzing the one or more predicted control variables based on an expected performance criterion includes determining if the one or more permissives generated within the simulation system enable the sequencing logic within the simulated process control network to progress from the process control state to the another process control state during the simulation.

19. The process control method of claim 13, further including periodically receiving a first state variable indicative of a current configuration of the process control network during operation of the process control network and periodically receiving a second state variable indicative of an operation of the process during operation of the process control network, and periodically configuring the simulated process control network with the first state variable and periodically updating the process model with the second state variable.

20. The process control method of claim 19, including periodically receiving the first and second state variables at a scan rate used by a process controller within the process control network.

21. The process control method of claim 13, including using two separate modes of operation to perform simulation, including using a first mode which includes periodically receiving the first and second state variables and updating the simulated process control network and the process model using the first and second state variables without executing a simulation of the process control system, and using a second mode which includes simulating the process control system to produce the one or more simulated control variables.

22. The process control method of claim 13, further enabling a user, via a user interface, to execute a simulation of the process control system and to automatically analyze the one or more predicted control variables from the simulation based on the expected performance criterion to determine if a problem exists within the operation of the process control system within the time horizon.

23. The process control method of claim 13, including automatically periodically executing the simulation system during on-line operation of the process control system and analyzing the one or more predicted process control variables from the simulation based on the expected performance criterion to determine if a problem exists within the operation of the process control system.

24. The process control system of claim 13, wherein detecting the one or more operational criteria includes performing an advanced pattern recognition analysis on the process control network using an advanced pattern recognition model.

25. The process control method of claim 24, further including storing one or more advanced pattern recognition (APR) models that define normal operation of the process control system at different stages of the process control system, and using different ones of the APR models based on the stage of the process control system to detect an abnormal situation in the process control system.

26. The process control method of claim 25, wherein the process control network includes sequencing logic having multiple stages and including storing a different APR model for each of multiple stages of the sequencing logic.

27. The process control method of claim 13, including developing the simulated process control network by copying the process control network.

28. A simulation system for use in simulating operation of a process controller coupled to a process, comprising:
a simulated process control network that uses one or more simulated process variables to produce one or more simulated control signals to simulate the operation of the process controller as coupled to the process;
a process model communicatively connected to the simulated process control network that uses the simulated control signals to produce the one or more simulated process variables;
a simulation coordination system communicatively coupled to the process controller and to the simulation system, wherein the simulation coordination system includes:
a simulation initiation module that initiates the simulation system during on-line operation of the process controller, wherein the simulation system executes a simulation faster than the real-time operation of the process controller using current process controller information to produce one or more predicted process control variables, and
a simulation analysis system coupled to the simulation system that receives the one or more predicted process control variables from the simulation system, wherein the simulation analysis system analyzes the one or more predicted process control variables to detect a future problem in the operation of the process controller as coupled to the process, and upon detecting the future problem in the process controller as coupled to the process, generates one or more indications of the future problem and provides the one or more indications of the future problem to a user; and
an operational criteria detection module coupled to the process controller and to the simulation coordination system, wherein the operational criteria detection module receives process control information from the process controller, analyzes the process control information against one or more expected performance measures to detect whether one or more operational criteria are met in the process controller, and upon detecting that the one or more operational criteria are met, initiates a simulation analysis via the simulation analysis system.

29. The system of claim 28, wherein the process controller includes sequencing logic that progresses from one process control state to another process control state in sequence based on one or more process variables, and wherein the simulation analysis system determines if the sequencing logic is predicted to progress from one process control state to another process control state in a particular period of time.

30. The system of claim 29, wherein the sequencing logic determines when to progress from one process control state to another process control state based on one or more permissives derived from the one or more process variables, and wherein the simulation analysis system determines if the one or more permissives generated within the simulation system enable the sequencing logic within the simulated process control network to progress from the one process control state to the another process control state during the simulation.

31. The system of claim 28, wherein the simulation coordination system includes an update module communicatively connected to the process controller to periodically receive a first state variable indicative of a current configuration of the process controller during operation of the process controller and to periodically receive a second state variable indicative of an operation of the process during operation of the process controller, wherein the update module periodically configures the simulated process control network with the first state variable and wherein the update module periodically uses the second state variable to update the process model.

32. The system of claim 31, wherein the update module periodically receives the first and second state variables at a scan rate used by the process controller.

33. The system of claim 28, wherein the operational criteria detection module comprises an advanced pattern recognition (APR) engine and one or more advanced pattern recognition (APR) models that define normal operation of the process controller as coupled to the process, and wherein the APR engine uses one of the APR models to detect an whether the one or more operational criteria are met in the process controller as coupled to the process.

34. The system of claim 33, wherein the process controller includes sequencing logic having multiple stages and wherein the operational criteria detection module includes a different APR model for each of multiple stages of the sequencing logic.

* * * * *

UNITED STATES PATENT AND TRADEMARK OFFICE
CERTIFICATE OF CORRECTION

| | |
|---|---|
| PATENT NO. | : 11,604,459 B2 |
| APPLICATION NO. | : 16/510431 |
| DATED | : March 14, 2023 |
| INVENTOR(S) | : Richard W. Kephart, Jr. et al. |

It is certified that error appears in the above-identified patent and that said Letters Patent is hereby corrected as shown below:

On the Title Page

Item (56), Line 13, "winter" should be -- Winter --.

At page 2, in Column 2, item (56), under "OTHER PUBLICATIONS", Line 2, "LEarning," should be -- Learning, --.

At page 2, in Column 2, item (56), under "OTHER PUBLICATIONS", Line 8, "fieldbs" should be -- fields --.

At page 2, in Column 2, item (56), under "OTHER PUBLICATIONS", Line 9, "automation," should be -- Automation, --.

At page 2, in Column 2, item (56), under "OTHER PUBLICATIONS", Line 12, "AlChE" should be -- AIChE --.

In the Specification

At Column 5, Line 58, "preform" should be -- perform --.

At Column 6, Lines 9-10, "DESCRIPTION OF THE PREFERRED EMBODIMENTS" should be -- DETAILED DESCRIPTION OF THE PREFERRED EMBODIMENTS --.

At Column 8, Line 1, "may which may" should be -- which may --.

At Column 8, Line 23, "in an" should be -- in and --.

At Column 9, Line 11, "well and" should be -- well as --.

Signed and Sealed this
Twentieth Day of January, 2026

John A. Squires
*Director of the United States Patent and Trademark Office*

CERTIFICATE OF CORRECTION (continued)
U.S. Pat. No. 11,604,459 B2

At Column 9, Line 19, "heat exchanges," should be -- heat exchangers, --.

At Column 9, Line 58, "which issued" should be -- which was issued --.

At Column 10, Line 3, "as well one" should be -- as well as one --.

At Column 10, Line 15, "of all" should be -- all --.

At Column 10, Lines 17-18, "applications (MMIs)," should be -- (MMIs) applications, --.

At Column 20, Line 30, "TCP/IP etc." should be -- TCP/IP, etc. --.